(12) United States Patent
Akin et al.

(10) Patent No.: US 10,427,734 B2
(45) Date of Patent: Oct. 1, 2019

(54) OMNIDIRECTIONAL TRACTION MODULE FOR A ROBOT

(71) Applicants: General Electric Company, Schenectady, NY (US); HIBOT CORPORATION, Tokyo (JP)

(72) Inventors: Selim Akin, Istanbul (TR); Thomas James Batzinger, Burnt Hills, NY (US); Selami Haydar Icli, Zurich (CH); Christopher Paul Markman, Canton, GA (US); Paulo Cesar Debenest, Tokyo (JP); Michele Guarnieri, Tokyo (JP); Giorgio Valsecchi, Tokyo (JP); Giacomo Cimarelli, Tokyo (JP); Shigeo Hirose, Tokyo (JP)

(73) Assignee: General Electric Company, Schenectady, NY (US)

(*) Notice: Subject to any disclaimer, the term of this patent is extended or adjusted under 35 U.S.C. 154(b) by 83 days.

(21) Appl. No.: 15/652,859

(22) Filed: Jul. 18, 2017

(65) Prior Publication Data

US 2019/0023334 A1 Jan. 24, 2019

(51) Int. Cl.
*B62D 55/10* (2006.01)
*B62D 55/065* (2006.01)
*B62D 55/116* (2006.01)

(52) U.S. Cl.
CPC .......... *B62D 55/10* (2013.01); *B62D 55/065* (2013.01); *B62D 55/116* (2013.01)

(58) Field of Classification Search
CPC .... B62D 55/10; B62D 55/065; B62D 55/116; B61B 13/10
See application file for complete search history.

(56) References Cited

U.S. PATENT DOCUMENTS 4,677,865 A 7/1987 Lehmann
4,683,973 A 8/1987 Honjo et al.
(Continued)

FOREIGN PATENT DOCUMENTS

CH 669127 A5 2/1989
EP 0171633 A1 2/1986
(Continued)

OTHER PUBLICATIONS

International Search Report and written opinion for corresponding PCT Application No. PCT/US2018/037900 dated Sep. 13, 2018, 14 pages.
(Continued)

*Primary Examiner* — Joseph M Rocca
*Assistant Examiner* — Michael R Stabley
(74) *Attorney, Agent, or Firm* — Juergen Hoffman; Hoffman Warnick LLC

(57) ABSTRACT

This disclosure provides systems and components for an omnidirectional traction module for use in a robot, such as a crawler robot used in in situ gap inspection in a machine, such as a generator, an electric motor, or a turbomachine. The traction module may include an outer frame and a rotating frame rotatably mounted within the outer frame. At least one drive system may be mounted within the rotating frame. The at least one dive system may have a fixed orientation within the rotating frame. An actuator may be operatively connected to the rotating frame to controllably rotate the rotating frame to a desired orientation for robot travel.

18 Claims, 10 Drawing Sheets

(56) References Cited

U.S. PATENT DOCUMENTS

| | | | |
|---|---|---|---|
| 4,889,000 A | 12/1989 | Jaafar et al. | |
| 4,970,890 A | 11/1990 | Jaafar et al. | |
| 5,172,639 A * | 12/1992 | Wiesman | F16L 55/28 104/138.2 |
| 5,650,579 A | 7/1997 | Hatley et al. | |
| 5,788,002 A | 8/1998 | Richter | |
| 5,947,051 A | 9/1999 | Geiger | |
| 5,969,531 A | 10/1999 | Murakami et al. | |
| 6,100,711 A | 8/2000 | Hatley | |
| 6,404,189 B2 | 6/2002 | Kwun et al. | |
| 6,814,169 B2 * | 11/2004 | Moore | B62D 57/024 180/9.21 |
| 6,876,222 B2 | 4/2005 | Fischer et al. | |
| 6,889,783 B1 | 5/2005 | Moore et al. | |
| 6,917,176 B2 * | 7/2005 | Schempf | G01M 3/005 318/568.11 |
| 6,959,603 B2 | 11/2005 | Knight et al. | |
| 7,188,568 B2 * | 3/2007 | Stout | F16L 55/32 104/138.2 |
| 7,218,993 B2 | 5/2007 | Yasukawa et al. | |
| 7,201,055 B1 | 10/2007 | Bagley et al. | |
| 7,331,436 B1 | 2/2008 | Pack et al. | |
| 7,520,189 B2 | 4/2009 | Abbasi et al. | |
| 7,600,593 B2 | 10/2009 | Filippov et al. | |
| 7,624,827 B2 | 12/2009 | Moser et al. | |
| 7,654,348 B2 | 2/2010 | Ohm et al. | |
| 7,681,452 B2 | 3/2010 | Bagley et al. | |
| 7,743,675 B2 | 6/2010 | Moore | |
| 7,866,421 B2 | 1/2011 | Moore et al. | |
| 7,891,445 B1 * | 2/2011 | McKinley | B60B 19/14 180/252 |
| 8,028,775 B2 * | 10/2011 | Orenbuch | B60B 33/08 180/252 |
| 8,220,345 B2 | 7/2012 | Moser et al. | |
| 8,477,891 B2 | 7/2013 | Wallace et al. | |
| 8,568,299 B2 | 10/2013 | Eno et al. | |
| 8,571,711 B2 | 10/2013 | Jacobsen et al. | |
| 8,839,684 B2 | 9/2014 | Banowetz et al. | |
| 9,031,698 B2 | 5/2015 | Smith | |
| 9,056,746 B2 * | 6/2015 | Mehrandezh | B62D 57/028 |
| 9,217,852 B2 | 12/2015 | Baleine | |
| D748,053 S | 1/2016 | Herrlich et al. | |
| D756,922 S | 5/2016 | Herrlich et al. | |
| 9,398,198 B2 | 7/2016 | Choi et al. | |
| 9,683,460 B2 | 6/2017 | Moore et al. | |
| 9,708,934 B2 | 7/2017 | Moore et al. | |
| 9,759,667 B2 | 9/2017 | Miasnikov et al. | |
| 9,808,140 B2 | 11/2017 | Belson et al. | |
| 2002/0104693 A1 | 8/2002 | Moore et al. | |
| 2002/0190682 A1 | 12/2002 | Schempf et al. | |
| 2004/0020002 A1 | 2/2004 | Moore et al. | |
| 2004/0099175 A1 * | 5/2004 | Perrot | F16L 55/28 104/138.1 |
| 2004/0173116 A1 | 9/2004 | Ghorbel et al. | |
| 2005/0104600 A1 | 5/2005 | Cotton | |
| 2008/0087112 A1 | 4/2008 | Bagley et al. | |
| 2008/0098832 A1 | 5/2008 | Abbasi et al. | |
| 2008/0121041 A1 | 5/2008 | Smith et al. | |
| 2008/0179115 A1 | 7/2008 | Ohm et al. | |
| 2008/0308324 A1 | 12/2008 | Moser et al. | |
| 2009/0120215 A1 | 5/2009 | Jacobson et al. | |
| 2009/0146680 A1 | 6/2009 | Moser et al. | |
| 2009/0171151 A1 | 7/2009 | Choset et al. | |
| 2011/0040427 A1 | 2/2011 | Ben-Tzvi | |
| 2013/0231779 A1 | 9/2013 | Purkayastha et al. | |
| 2014/0022374 A1 | 1/2014 | Brignac et al. | |
| 2014/0067185 A1 | 3/2014 | Tralshawala et al. | |
| 2014/0216836 A1 * | 8/2014 | Davies | B62D 55/06 180/164 |
| 2014/0345384 A1 | 11/2014 | Nguyen | |
| 2015/0233787 A1 | 8/2015 | Eakins et al. | |
| 2015/0251318 A1 * | 9/2015 | Lv | A47L 9/009 180/8.1 |
| 2015/0323469 A1 | 11/2015 | Clayton et al. | |
| 2016/0075020 A1 | 3/2016 | Szarski et al. | |
| 2016/0239080 A1 | 8/2016 | Marcolina et al. | |
| 2017/0362068 A1 | 12/2017 | Cheng | |
| 2018/0021945 A1 | 1/2018 | Pettersen et al. | |

FOREIGN PATENT DOCUMENTS

| | | |
|---|---|---|
| EP | 0390352 A2 | 10/1990 |
| EP | 1863153 A2 | 12/2007 |
| EP | 2345902 A1 | 7/2011 |
| EP | 2743447 A1 | 6/2014 |
| FR | 2355236 A1 | 1/1978 |
| JP | 2007256262 A | 10/2007 |
| WO | 9702452 | 1/1997 |
| WO | 2008076193 A2 | 6/2008 |
| WO | 2015095543 A1 | 6/2015 |
| WO | 2016138529 A1 | 9/2016 |
| WO | 2016141769 A1 | 9/2016 |

OTHER PUBLICATIONS

International Search Report and written opinion for corresponding PCT Application No. PCT/US2018/041726 dated Oct. 29, 2018, 16 pages.

International Search Report and Written Opinion for PCT Application No. PCT/DK96/00298 dated Oct. 17, 1996, 25 pages.

U.S. Appl. No. 15/652,680, Office Action dated Mar. 18, 2019, 316383-1, 22 pages.

International Search Report and written opinion for corresponding PCT Application No. PCT/US2018/035329 dated Sep. 11, 2018, 18 pages.

International Search Report and written opinion for corresponding PCT Application No. PCT/US2018/038453 dated Oct. 25, 2018, 17 pages.

International Search Report and written opinion for corresponding PCT Application No. PCT/US2018/040982 dated Oct. 17, 2018, 15 pages.

U.S. Appl. No. 15/652,730, Notice of Allowance dated May 3, 2019, 9 pages.

U.S. Appl. No. 15/652,805, Office Action dated Jun. 27, 2019, 13 pgs.

U.S. Appl. No. 15/652,680, Notice of Allowance dated Jul. 17, 2019, 8 pgs.

* cited by examiner

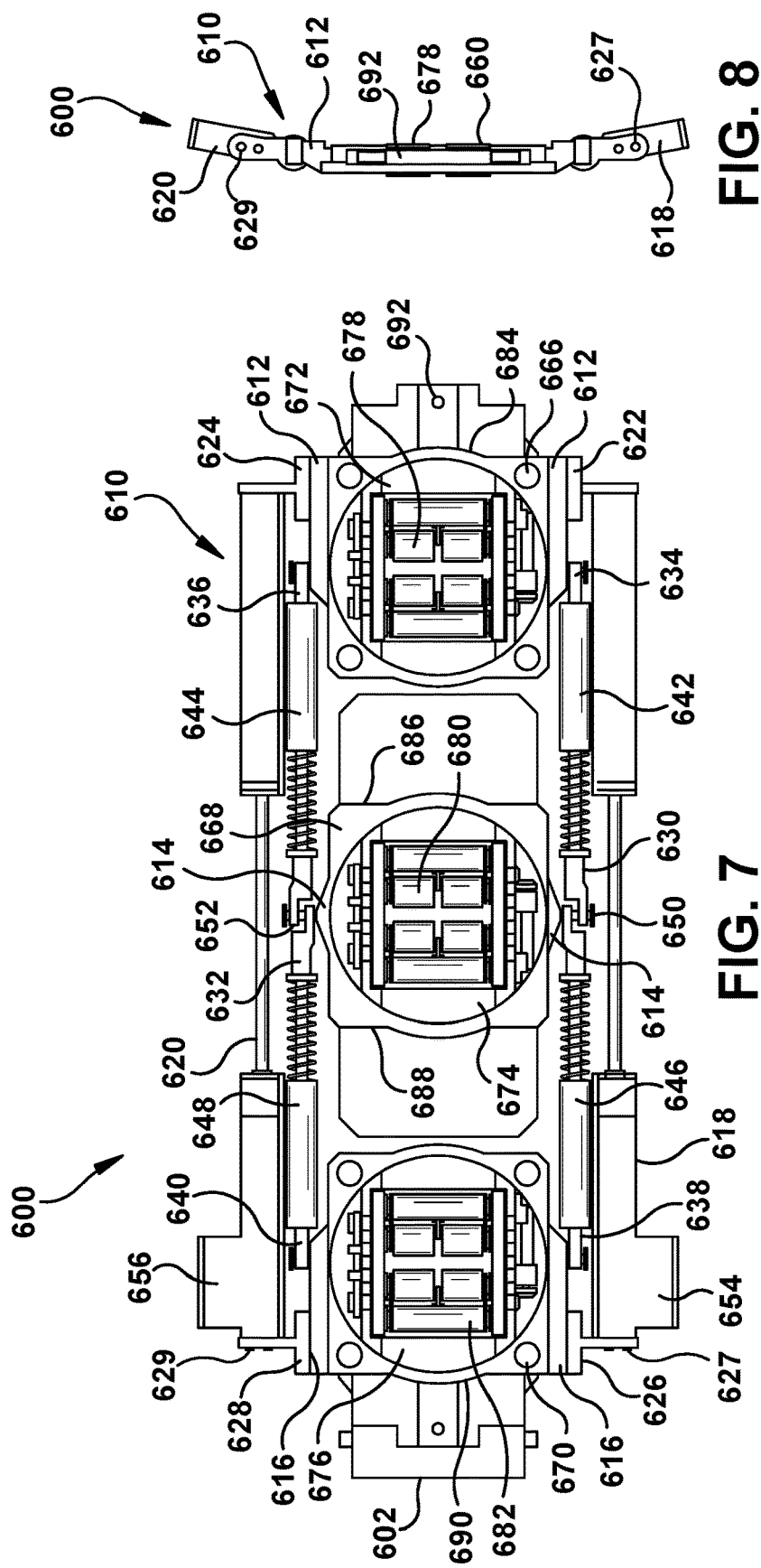

OMNIDIRECTIONAL TRACTION MODULE FOR A ROBOT

BACKGROUND OF THE INVENTION

The disclosure relates to robots for inspection of machinery and, more specifically, a robot for multidirectional travel along one or more surfaces of a machine.

The disclosure is related to concurrently filed U.S. patent application Ser. No. 15/652,730, entitled "MODULAR CRAWLER ROBOT FOR IN SITU GAP INSPECTION" filed Jul. 18, 2017, the entire contents of which are incorporated herein by reference. The disclosure is related to concurrently filed U.S. patent application Ser. No. 15/652,771, entitled "END REGION INSPECTION MODULE AND METHOD FOR IN SITU GAP INSPECTION ROBOT SYSTEM" filed Jul. 18, 2017, the entire contents of which are incorporated herein by reference. The disclosure is related to concurrently filed U.S. patent application Ser. No. 15/652,680, entitled "IN SITU GAP INSPECTION ROBOT SYSTEM AND METHOD" filed Jul. 18, 2017, the entire contents of which are incorporated herein by reference. The disclosure is related to concurrently filed U.S. patent application Ser. No. 15/652,805, entitled "ACTUATED SENSOR MODULE AND METHOD FOR IN SITU GAP INSPECTION ROBOTS" filed Jul. 18, 2017, the entire contents of which are incorporated herein by reference.

A visual and/or electrical inspection of a generator, electric motor, or turbomachine should be performed on a periodic basis. For example, generators may be inspected and tested periodically in the field for stator wedge tightness, visual surface anomalies, core imperfections, low flux, etc. Generator/stator inspection and testing procedures may require complete disassembly of the stator and removal of the generator rotor from the stator before any inspections or tests can be performed on the unit. The cost of disassembly and removal of the rotor, the time it takes for this process, and the dangers of rotor removal may impact the frequency of such inspections.

In situ inspection of generators have been performed employing poles, trolleys, scopes, and rotor turning techniques. These procedures may not accomplish the inspection task in a complete, timely, or safe manner.

Use of a robotic crawler capable of insertion through the radial air gap between the core iron and the retaining ring permits in situ inspection of the rotor and the stator core. The crawler may be inserted in a collapsed position into the gap and expanded to the width of the air gap. One or more traction modules may drive movement of the crawler. The crawler may be remotely controlled by a technician and provides video cameras and other inspection tools to perform generator rotor and stator inspections within the air gap as the crawler is drive to selected locations. The crawler may be maneuvered by the technician within the air gap using video for both navigation and visual inspection.

BRIEF DESCRIPTION OF THE INVENTION

A first aspect of this disclosure provides an omnidirectional traction module for a robot. A rotating frame is rotatably mounted within an outer frame. At least one drive system is mounted within the rotating frame. The at least one dive system has a fixed orientation within the rotating frame. An actuator is operatively connected to the rotating frame to controllably rotate the rotating frame to a desired orientation.

A second aspect of the disclosure provides a robot system with an omnidirectional traction module. A robot body and control system are connected to at least one traction module. The traction module is attached to the body and includes an outer frame and a rotating frame rotatably mounted within the outer frame. At least one drive system is mounted within the rotating frame. The at least one dive system has a fixed orientation within the rotating frame and receives move control signals from the control system. An actuator is operatively connected to the rotating frame to controllably rotate the rotating frame to a desired orientation in response to a direction control signal from the control system.

A third aspect of the disclosure provides a modular robot system with omnidirectional traction modules. The modular robot system includes a plurality of modular frame members, including at least one link member with a shock absorber. A plurality of traction modules are removably attached to the plurality of modular frame members to position the plurality of traction modules against at least one surface of a machine. The plurality of traction modules include at least one drive system mounted within a rotating frame and rotatable to orient the at least one drive system around a 360 degree arc. A plurality of sensor interface adapters are removably attached to the plurality of traction modules. A plurality of sensor modules are removably attached to the plurality of sensor interface adapters.

The illustrative aspects of the present disclosure are arranged to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 7 shows a top view of the robotic crawler of FIG. 6 in its collapsed state.

FIG. 8 shows an end view of the robotic crawler of FIG. 6 in its collapsed state.

Figure 1:
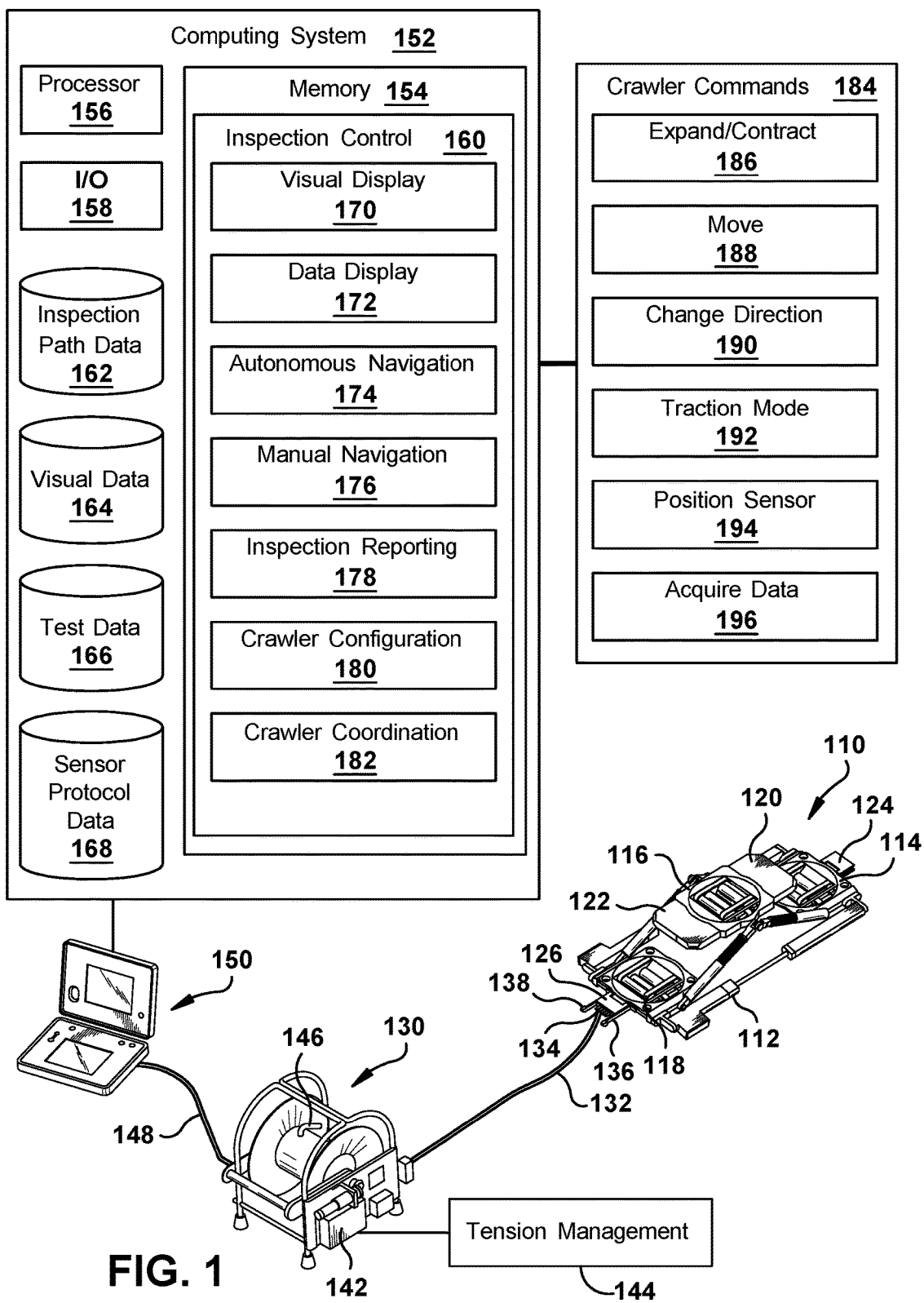
FIG. 1 shows a diagram of an example system for in situ gap inspection according to various embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Where an element or layer is referred to as being "on," "engaged to," "disengaged from," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Referring to FIG. 1, an example system 100 for in situ gap inspection is shown. System 100 may include a robotic crawler 110, a tether reel 130, and a control system 150. Robotic crawler 110 may be configured to be inserted through an entrance gap into an annular gap in a machine to conduct autonomous or semi-autonomous inspection of the machine. For example, robotic crawler 110 may be a collapsible robot that can operate in a collapsed or expanded state and may be inserted through a narrow entrance gap in its collapsed state and expand to a wider gap width such that it engages the opposed surfaces of the annular gap. Robotic crawler 110 is shown in its expanded state in FIG. 1. Once in the annular gap, robotic crawler 110 may navigate the annular gap and use one or more sensor modules to conduct various inspection tests during its movements or at various desired crawler positions in the annular gap. Robotic crawler 110 may be configured for multidirectional movement, including forward and reverse movement in the axial direction and bi-directional lateral movement in the circumferential direction. In some embodiments, robotic crawler 110 may be configured for omnidirectional movement that includes bi-directional movement in any orientation between the axial and circumferential directions, in addition to the axial and circumferential directions. For example, robotic crawler 110 may be configured to move in any direction in a 360 degree arc and freely change its direction of travel to any orientation in the 360 degree arc, including a plurality of directions between and angled from the axial and circumferential directions. In some embodiments, robotic crawler 110 may include a tether 132 connected to robotic crawler 110 and extending out of the machine during operation. For example, tether 132 may be a cable connected to robotic crawler 110 to enable retrieval of robotic crawler 110 in the event that robotic crawler 110 cannot navigate out of the annular gap under its own power. In some embodiments, tether 132 may provide a physical connection from robotic crawler 110 for a wired communication channel and/or a remote power source and/or pneumatic or hydraulic lines to support test systems or robotic operation. Tether reel 130 may be automated to adjust the tension and/or slack on tether 132 during operation of robotic crawler 110 within the annular gap, enabling robotic crawler 110 to navigate various navigation paths and perform inspection routines without a user manually managing the position of the tether. Control system 150 may be in communication with robotic crawler 110 to provide control signals to robotic crawler 110 and receive sensor, navigation, and/or other operational data from robotic crawler 110. In some embodiments, control system 150 may be electrically connected to tether 132 directly or through tether reel 130 and the electrical connection may include one or both of a power channel and a communication channel. Control system 150 may provide a user interface for a user to monitor, evaluate, supplement, and/or control robotic crawler 110 during an inspection deployment within the annular gap of the machine.

In some embodiments, robotic crawler 110 is a modular robot that may be reconfigured for different inspection tasks and enabling efficient maintenance, replacement, and/or upgrade of individual modules. Robotic crawler 110 may include a body frame, such as an expandable body 112, for receiving, positioning, and connecting various modules relative to one another. In some embodiments, expandable body 112 accommodates a plurality of traction modules 114, 116, 118. For example, robotic crawler 110 may include three traction modules 114, 116, 118, a forward traction module 114, a middle traction module 116, and a rear traction module 118, where forward traction module 114 and rear traction module 118 are configured to engage a first surface in the annular gap and the middle traction module 116 is configured to engage an opposed second surface in the annular gap. Traction modules 114, 116, 118 may be multidirectional traction module capable of moving robotic crawler 110 in multiple directions, including both axial and circumferential movement within the annular gap. Robotic crawler 110 may further include a plurality of sensor modules 120, 122, such as visual sensors for navigation and/or visual inspection. For example, sensor modules 120, 122 may be attached via sensor interfaces on the forward and rear sides of middle traction module 116 and may provide both forward and rear facing navigation cameras, as well as one or more upward facing cameras for inspecting the adjacent surface of the annular gap. Robotic crawler 110 may also include one or more tether connectors 124, 126 for detachably receiving tether 132, generally with a compatible end connector 134 and fasteners 136, 138.

In some embodiments, tether reel 130 is an automated tether reel that may receive, release, and spool tether 132 to adjust tension as needed during operation of robotic crawler 110. For example, tether reel 130 may include a servo motor 142 and tension management logic 144. For example, servo motor 142 operating in a torque/current control mode may detect changes in tension on tether 132 as it enters tether reel 130 and tension management logic 144 may provide an algorithm for maintaining an acceptable tension range using servo motor 142 to reel in or reel out tether 132 under closed loop control. In some embodiments, tether 132 may have a fixed connection 146 to tether reel 130 and a separate wire 148 may connect to control system 150. For example, wire 148 may provide communication and/or power channels without providing the mechanical characteristics desired for tethering robotic crawler 110. In some embodiments, tether reel 130 may provide an interface for receiving control signals for tether reel 130 from control system 150. For example, control system 150 may be able to adjust tension control or motor parameters and/or manually override operation of tether reel 130. In some embodiments, robotic crawler 110 may operate without a tether, carry its own power (e.g. batteries), and/or use wireless communication with control system 150.

In some embodiments, control system 150 may include a computing system 152. Computing system 152 may provide a plurality of programmatic controls and user interface for operating robotic crawler 110. In some embodiments, computing system 152 is a general purpose computing devices, such as a personal computer, work station, mobile device, or an embedded system in an industrial control system (using general purpose computing components and operating systems). In some embodiments, computing system 152 may be a specialized data processing system for the task of controlling operation of system 100. Computing system 152 may include at least one memory 154, processor 156, and input/output (I/O) interface 158 interconnected by a bus. Further, computing system 152 may include communication with external I/O device/resources and/or storage systems, including connected system, such as robotic crawler 110, tether reel 130, and network resources. In general, processor 156 executes computer program code, such as inspection control module 160, that is stored in memory 154 and/or a storage system. While executing computer program code, processor 156 can read and/or write data to/from memory 154, storage systems, and I/O devices (through I/O interface 158). The bus provides a communication link between each of the components within computing system 152. I/O devices may comprise any device that enables a user to interact with computing system 152 (e.g., keyboard, pointing device, display, etc.). Computing system 152 is only representative of various possible combinations of hardware and software. For example, the processor may comprise a single processing unit, or be distributed across one or more processing units in one or more locations, e.g., on a client and server. Similarly, memory and/or storage systems may reside at one or more physical locations. Memory and/or storage systems can comprise any combination of various types of non-transitory computer readable storage medium including magnetic media, optical media, random access memory (RAM), read only memory (ROM), etc. In some embodiments, computing system 152 is a laptop computer in communication with robotic crawler 110 via a wired (serial, USB, Ethernet, etc.) or wireless (802.11, Bluetooth, etc.) connection and running application software for system 100. In some embodiments, some or all of the functions of computing system 152 may be on board robotic crawler 110 using an integrated computing system, such as an on board control module, with or without wireless communication to one or more user interfaces and/or remote data storage.

In some embodiments, computing system 152 may include one or more application programs, data sources, and/or functional modules for controlling robotic crawler 110. For example, computing system 152 may include inspection control module 160 that operates in conjunction with data sources 162, 164, 166, 168 to provide control signals to and receive data from robotic crawler 110. Inspection control module 160 may provide a visual display module 170. For example, visual data collected by cameras on robotic crawler 110 may be displayed by visual display module 170, such as a graphical user interface for one or more video feeds. In some embodiments, visual data from robotic crawler 110 may be stored in visual data source 164 for use by visual display module 170 and/or selective, temporary, and/or archival storage of visual data for later use, including use by other users or systems. Data display module 172 may provide display, including visual display, of other test data, including processed visual data and resulting calculations or analysis. For example, data display module 172 may include a graphical user interface for test results from one or more test protocols using sensor and navigation data from robotic crawler 110. In some embodiments, test data from robotic crawler 110 may be stored in test data source 166 for use by data display module 172 and/or selective, temporary, and/or archival storage of test data for later use, including use by other users or systems. Data display module 172 may include a real-time display of test data as it is collected by robotic crawler 110 and/or one or more functions for viewing, aggregating, analyzing, visualizing, selecting, and/or reporting test data from test data source 166. Autonomous navigation module 174 may provide a protocol or series of commands for navigation of robotic crawler 110 within the annular gap of the machine. In some embodiments, autonomous navigation module 174 enables a user to select an inspection path from a plurality of inspection paths stored in inspection path data source 162. For example, inspection paths may be defined as physical paths robotic crawler 110 should follow within the annular gap to complete one or more inspection tasks in one or more locations within the annular gap. Inspection paths may be based on a physical schematic or parameters of one or more machines defining axial and circumferential distances. Inspection paths may also include parameters and locations related to specific features of interest for either navigation (e.g., surface features to be avoided) or for testing (e.g., locations or corresponding crawler positions for conducting specific tests). In some embodiments, inspection paths may be stored and defined in terms of a sequence of crawler commands. Autonomous navigation module 174 may enable autonomous navigation by robotic crawler 110 receiving and executing a sequence of crawler commands without user intervention once the autonomous operation is initiated. In some embodiments, autonomous navigation module 174 may have completely autonomous inspection routines that require no user intervention once initiated or may include a plurality of inspection subroutines, such as specific movement patterns, position changes, or test protocols, that are initiated in a desired sequence by a user, potentially based on navigational, visual, or test data feedback. Manual navigation module 176 may provide a user with the ability to pilot or otherwise control robotic crawler 110. In some embodiments, manual navigation module 176 may be provided for establishing an initial position for initiating automated control and/or allow a user to override automated control in response to problems, exceptions, or specific test protocols (such as an initial test result that requires further data gathering). In some embodiments, control system 150 may include one or more user I/O interfaces for manually controlling robotic crawler 110, such as joysticks and other tactile controls, for navigation, deploying sensors, and conducting various test protocols. Inspection module 178 may provide a plurality of routines for various inspection protocols using one or more sensor modules. In some embodiments, one or more sensor protocols are stored in sensor protocol data source 168 for use by inspection module 178. For example, a visual inspection protocol may include activating and capturing visual data from one or more sensor modules on robotic crawler 110 along a defined navigation path to enable mapping of captured visual data to location information with the machine. In some embodiments, a plurality of cameras with varying facings and/or positionable cameras may be present in one or more sensor modules 120, 122 and a visual inspection module may include selective activation and positioning of robotic crawler 110 and its various cameras. An inspection protocol executed by inspection module 178 may include a combination of navigational elements (navigation path, autonomous positioning, and/or manual positioning) and sensor protocols (position requirements, deployment, activation, timing/sampling, parameters, etc.). In some embodiments, inspection module 178 may define the storage of visual data and test data in visual data source 164 and test data source 166 and/or the display of visual data by visual display module 170 and test data by data display module 172. Crawler configuration module 180 may provide data regarding the configuration of modules and related capabilities and protocols for any given configuration of robotic crawler 110. In some embodiments, crawler configuration module 180 may map crawler configurations to machine specifications and sensor protocols to assist a user in matching inspection protocols with the resources available for a given test deployment. For example, a given configuration of sensor modules may define the test capabilities of robotic crawler 110 and recommend specific inspection protocols to utilize those sensor modules. In some embodiments, crawler configuration module 180 may include a library of sensor modules and related capabilities and support user reconfiguration of robotic crawler 110 for a desired inspection protocol. Crawler configuration module 180 may also define the set of crawler commands 184 that may be used to control robotic crawler 110. Crawler coordination module 180 may enable inspection control module 160 to control more than one robotic crawler 110 simultaneously. In some embodiments, crawler coordination module 182 may maintain a plurality of communication channels for control signals and data signals with a plurality of robotic crawlers. For example, crawler coordination 180 may manage a plurality of instances of visual display module 170, data display module 172, autonomous navigation module 174, manual navigation module 176, inspection module 178, and crawler configuration module 180 for parallel management of the plurality of robotic crawlers. In some embodiments, crawler coordination module 182 may include interference protection for tracking the current crawler positions, navigation paths, and timing of various movements and sensor protocols to prevent collisions or other interference within the annular gap.

In some embodiments, visual display module 170, data display module 172, autonomous navigation module 174, manual navigation module 176, and inspection module 178 may be configured to issue one or more crawler commands 184 to robotic crawler 110 to complete some aspect of their function. Crawler commands 184 may then be translated into messages or control signals from control system 150 to robotic crawler 110. In some embodiments, crawler configuration module 180 may define the set of crawler commands available to the other modules based on the configuration of robotic crawler 110. An example set of crawler commands 184 are provided, but will be understood to be neither exclusive nor exhaustive of the possible crawler commands that could be used to control robotic crawler 110 and various configurations of traction modules, sensor modules, and body frame mechanics possible. Robotic crawler 110 may receive expand/contract commands 186 to expand or contract expandable body 112 between a collapsed state and one or more expanded states, such as a control signal to one or more motors that drive the body position. In some embodiments, expand or contract may be based on feedback from sensors within robotic crawler 110 when the traction modules are in a planar position (for collapsed state) or have contacted opposed surfaces in the annular gap (for expanded state). In other embodiments, expand or contract may be based on time (e.g. activate motor for x seconds of expansion or contraction) or distance (e.g., set crawler width to y inches). Robotic crawler 110 may receive move commands 188 to drive its traction modules forward or backwards (based on the present alignment of the traction modules in the case of multidirectional traction modules). Robotic crawler 110 may receive change direction commands 190 to reorient its traction modules and direction of travel. For example, change direction commands 190 may allow multidirectional traction modules to rotate 90 degrees and change from axial orientation and directions of travel to circumferential orientation and directions of travel. In some embodiments, change direction commands 190 may include orientation changes of greater or less than 90 degrees and include a feedback signal for confirming orientation or traction modules and communicating orientation back to control system 150. Robotic crawler 110 may receive traction mode commands 192 to drive changes in the configuration of the traction modules for different traction modes. For example, traction modules may include a flat mode for robot insertion and/or low profile and smooth surface travel and a clearance mode for providing clearance between the body of robotic crawler 110 and the surfaces it is moving along and/or traversing obstacles or uneven surfaces. Traction mode commands 192 may include control signals to change from flat mode to clearance mode or from clearance mode to flat mode. Robotic crawler 110 may receive position sensor commands 194 for sensor modules that include deployment and/or positioning features. For example, some sensor modules may include electromechanical features for extending, raising, lowering, rotating, or otherwise positioning one or more elements of the sensor module before, during, or after data collection. Position sensor commands 194 may include a control signal to activate a motor for extending or otherwise repositioning a sensor from robotic crawler 110 to position it for data collection or for moving a sensor (such as by rotation) independent of changing crawler position during data collection. Robotic crawler 110 may receive acquire data commands 196 for initiating data collection through a sensor module using whatever modality is present in that sensor module. Acquire data commands 196 may provide a start or stop signal for a continuous data collection mode, such as a video feed from the camera(s) of a visual sensor, or a specific test sequence for a more discrete sensor test, such as a mechanical wedge tightness test. It will be understood that some robotic crawlers and control systems may be able to communicate and manage multiple commands in parallel, as overlapping sequences, or as serial command series. Crawler coordination module 182 may enable control system 150 to issue commands to and acquire data from multiple robotic crawlers in parallel.

Figure 2:
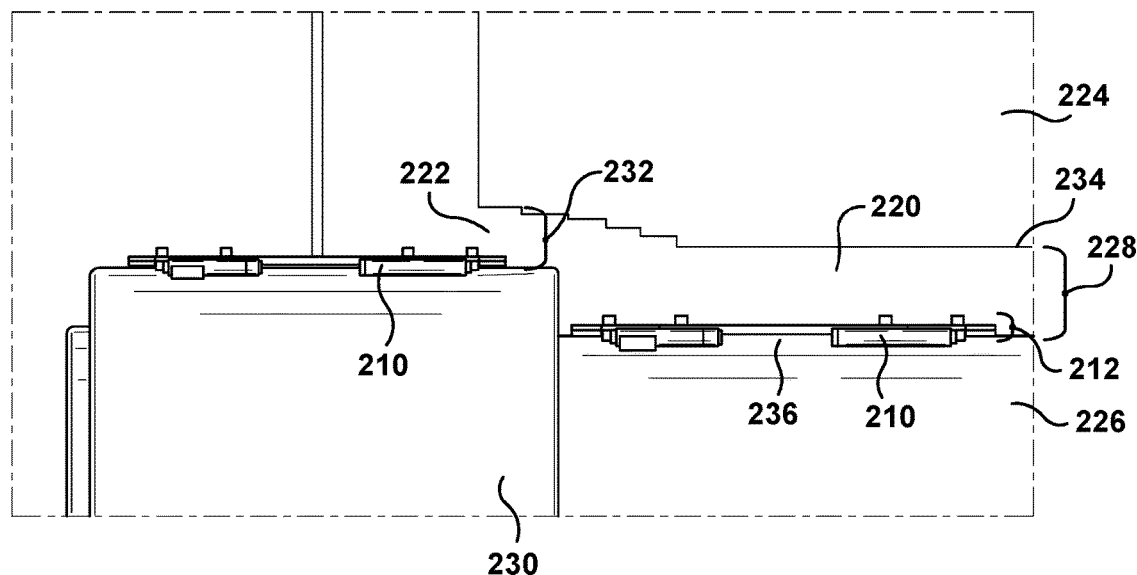
FIG. 2 shows a side section view of gap insertion of a robotic crawler into a machine.

Referring to FIG. 2, an in situ gap inspection system 200 is shown with a robotic crawler 210, such as robotic crawler 110 in FIG. 1, being inserted into a machine 202. Machine 202 may include an annular gap 220 accessible through an entrance gap 222 and, more specifically, a variety of machine configurations of generators, electric motors, or turbomachines. For example, a generator may allow insertion through the circumferential air gap between the core iron and the retaining ring permits in situ inspection of the rotor and the stator core. Annular gap 220 may be defined between a cylindrical central member 226 and a surrounding cylindrical member 224 with generally complementary curvature. In some embodiments, annular gap 220 may be an air gap generally defined by: (the inner diameter of the stator minus the outer diameter of the rotor) divided by two. Annular gap 220 has an axial length from a first end to a second end of cylindrical central member 226 and a circumference measured in the direction of the circumference of cylindrical central member 226. Annular gap 220 has an annular gap width 228 measured from outer surface 236 of cylindrical central member 226 to the nearest opposite surface (inner surface 234) of surrounding cylindrical member 224. In some embodiments, entrance gap 222 may be an air gap at an end of the central cylindrical member 226 and have the same entrance width as annular gap width 228. In other embodiments, entrance gap 222 may include additional features, such as a retaining member 230, that further constrain entrance gap 222 and define an entrance gap width 232 is that is less than annular gap width 228. In some embodiments, additional features or obstacles may reduce annular gap width 228, such entrance baffles used to direct cooling air flow.

In FIG. 2, robotic crawler 210 is in a collapsed state, where its traction modules are aligned in a single plane. Robotic crawler 210 is shown outside entrance gap 222 before insertion and inside annular gap 220 after insertion. Robotic crawler 210 may define a collapsed crawler width 212. Collapsed crawler width 212 may be less than both entrance gap width 232 and annular gap width 228. In its collapsed state, robotic crawler 210 engages only outer surface 236 of central cylindrical member 226 inside annular gap 220.

Figure 3:
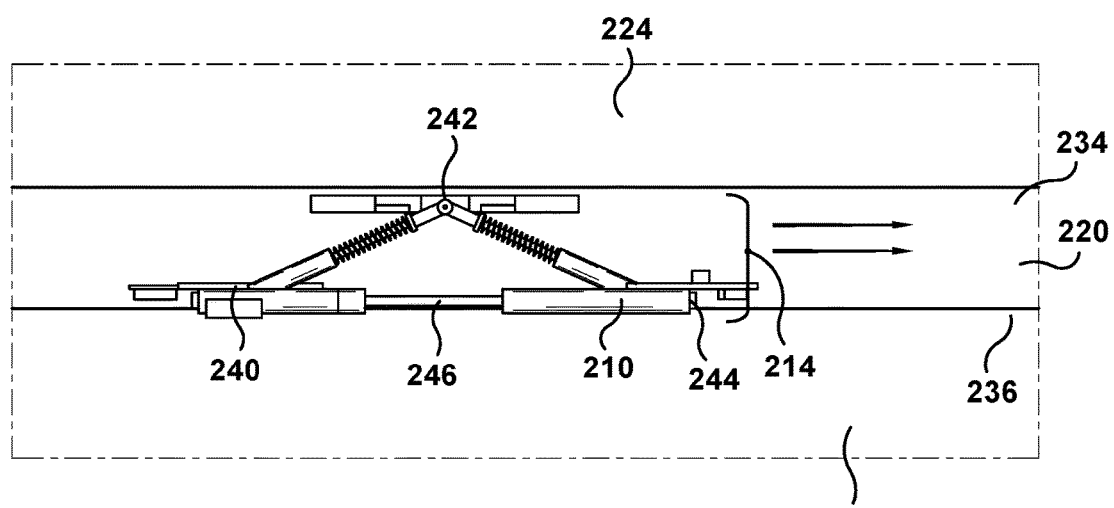
FIG. 3 shows a side section view of an expanded robotic crawler in the annular gap of a machine.
Figure 4:
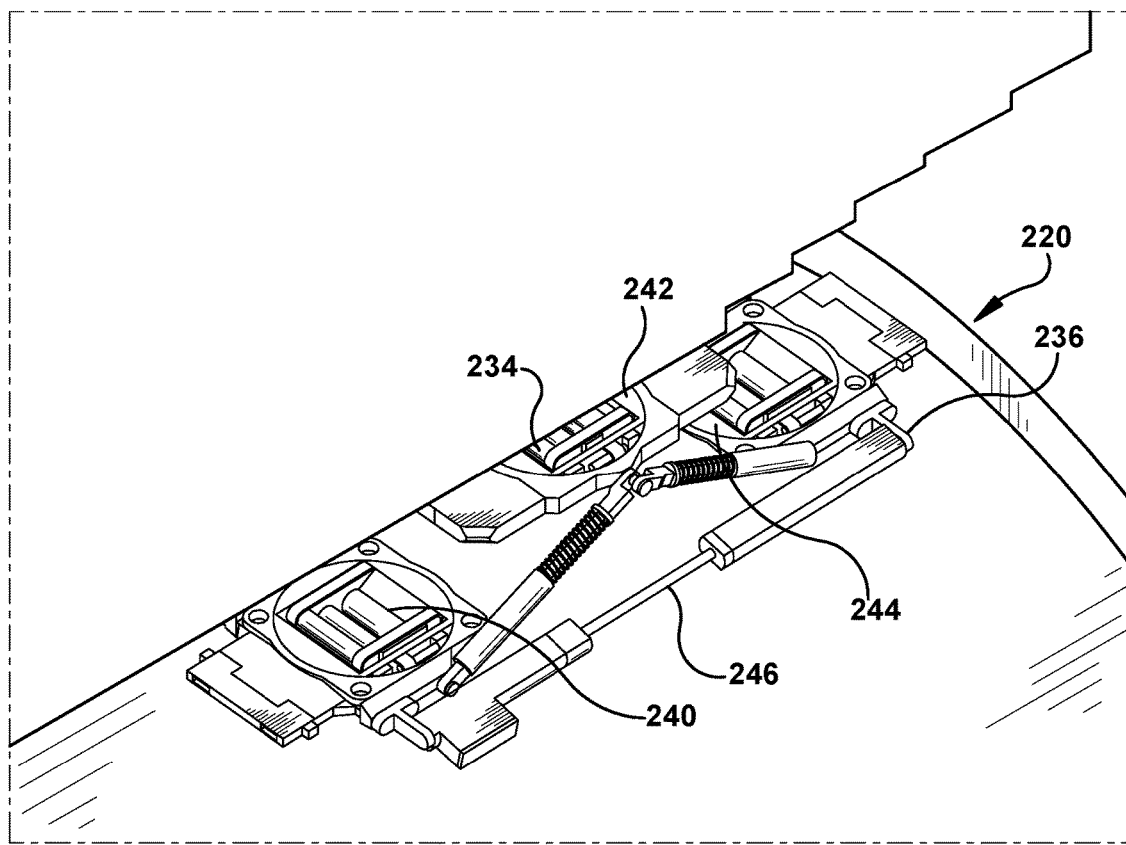
FIG. 4 shows a perspective cutaway view of an expanded robotic crawler in the annular gap of a machine according to various embodiments of the disclosure.

FIGS. 3-4 show two views of robotic crawler 210 in an expanded state within annular gap 220. When robotic crawler 210 is in its expanded state, it may engage opposed surfaces 234, 236. In an expanded state, robotic crawler 210 may define an expanded crawler width 214. Expanded crawler width 214 may be larger than collapsed crawler width 212 and entrance gap width 232, and equal to annular gap width 228 such that surface contact may be maintained with opposed surfaces 234, 236. In some embodiments, robotic crawler 210 comprises a plurality of traction modules 240, 242, 244 mounted in an expandable body 246. Traction modules 240, 244 may engage only outer surface 236 of central cylindrical member 226 and traction module 242 may engage only inner surface 234 of surrounding cylindrical member 236. In some embodiments, the configuration of traction modules 240, 242, 244 may be reversed and traction modules 240, 244 may engage only inner surface 234 of surrounding cylindrical member 236 and traction module 242 may engage only outer surface 236 of central cylindrical member 226. Traction modules 240, 242, 244 may include rollers, including wheels, balls, or tracks, to move robotic crawler 210 through annular gap 220 based on moving surface contact with opposed surfaces 234, 236. Traction modules 240, 242, 244 may move robotic crawler 210 on a desired navigation path through annular gap 220.

Figure 5A:
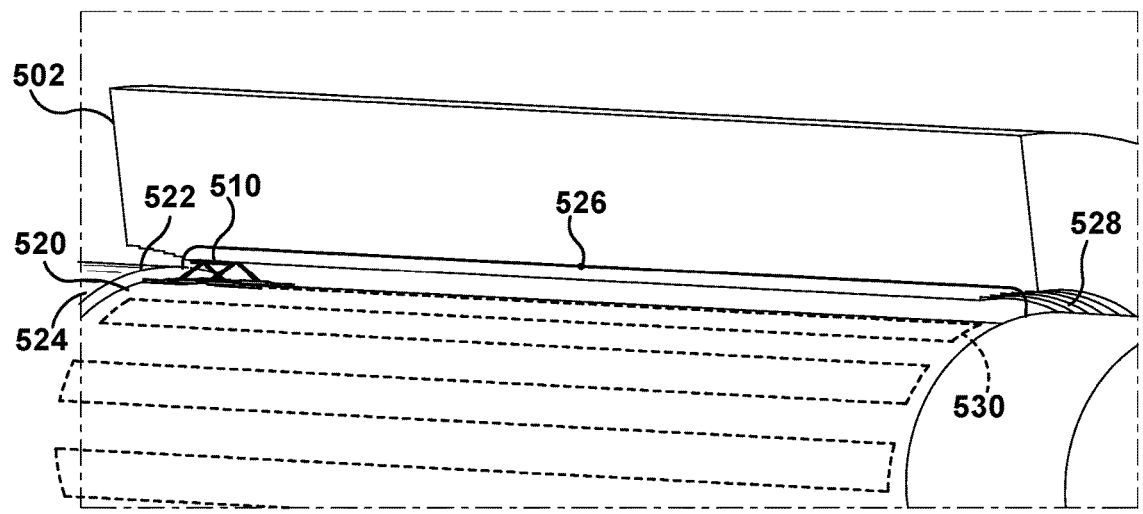
FIGS. 5A and 5B show example inspection paths of a robotic crawler in the annular gap of a machine.
Figure 5B:
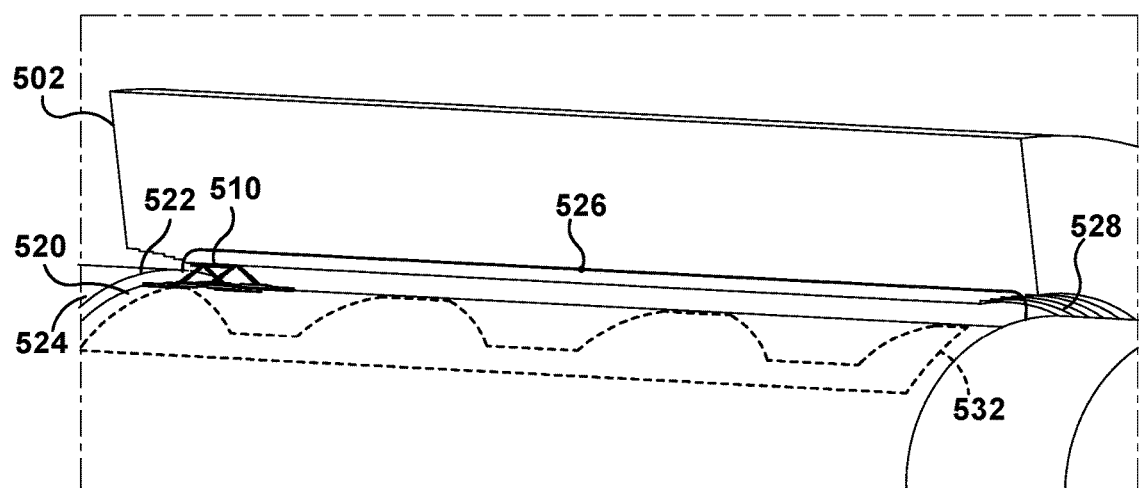

Referring to FIGS. 5A and 5B, another embodiment of a robotic crawler 510 is shown in an annular gap 520 with lines 530, 532 showing example navigation paths for inspecting annular gap 520. Robotic crawler 510 is shown in an expanded state in a starting crawler position just inside entrance gap 522 adjacent an entrance end portion 524 of the machine 502. Following line 530, robotic crawler 510 moves in a forward axial direction along a gap length 526 of annular gap 520 from the entrance end portion 524 to the closed end portion 528. In some embodiments, robotic crawler 510 may reach a step or other obstacle representing the end of the navigable gap length 526 of annular gap 520. For example, closed end portion 528 may include a step created by a retaining ring or other feature and may include another air gap into an enclosed end region of the machine. Robotic crawler 510 may include multidirectional traction modules that enable it to change its travel direction from the axial direction to the circumferential direction. Line 530 shows a number of circumferential steps along the circumference of annular gap 520. The length of the circumferential step may depend on a variety of factors related to sensor range/area (or field of view for visual sensors), test locations, desired test coverage or sampling, and/or specific machine features to be included in the navigation path to support desired test protocols using the sensor modules on robotic crawler 510. After a new circumferential position is achieved, line 530 shows a return path in the reverse axial direction along gap length 526. Robotic crawler 510 may reorient its movement direction back to an axial orientation and move in the opposite direction down the length of annular gap 520. In some embodiments, robotic crawler 510 may reach a step or other obstacle associated with entrance gap 522 and representing the end of the navigable gap length 526 of annular gap 520. Robotic crawler 510 may again reorient its travel direction for circumferential movement and make another circumferential step. Robotic crawler 510 may continue stepping through these axial passes at various circumferential positions along the circumference for the area of annular gap 520 to be inspected with the selected sensor modules and inspection protocol. In some embodiments, robotic crawler 510 may traverse gap length 236 in circumferential positions providing overlapping coverage for visual inspection around the entire circumference of annular gap 520 to provide a complete visual inspection of the surfaces of annular gap 520. Following line 532 shows an alternate inspection path and is provided to demonstrate that a plurality of inspection paths may be enabled by multidirectional and omnidirectional movement. Line 532 takes robotic crawler 510 along an inspection path that includes axial travel, circumferential travel, and travel along intermediate orientations between the axial and circumferential directions. More complex and less repetitious inspection paths may be used for inspection of specific areas or features, as well as to navigate around known obstacles.

Figure 6:
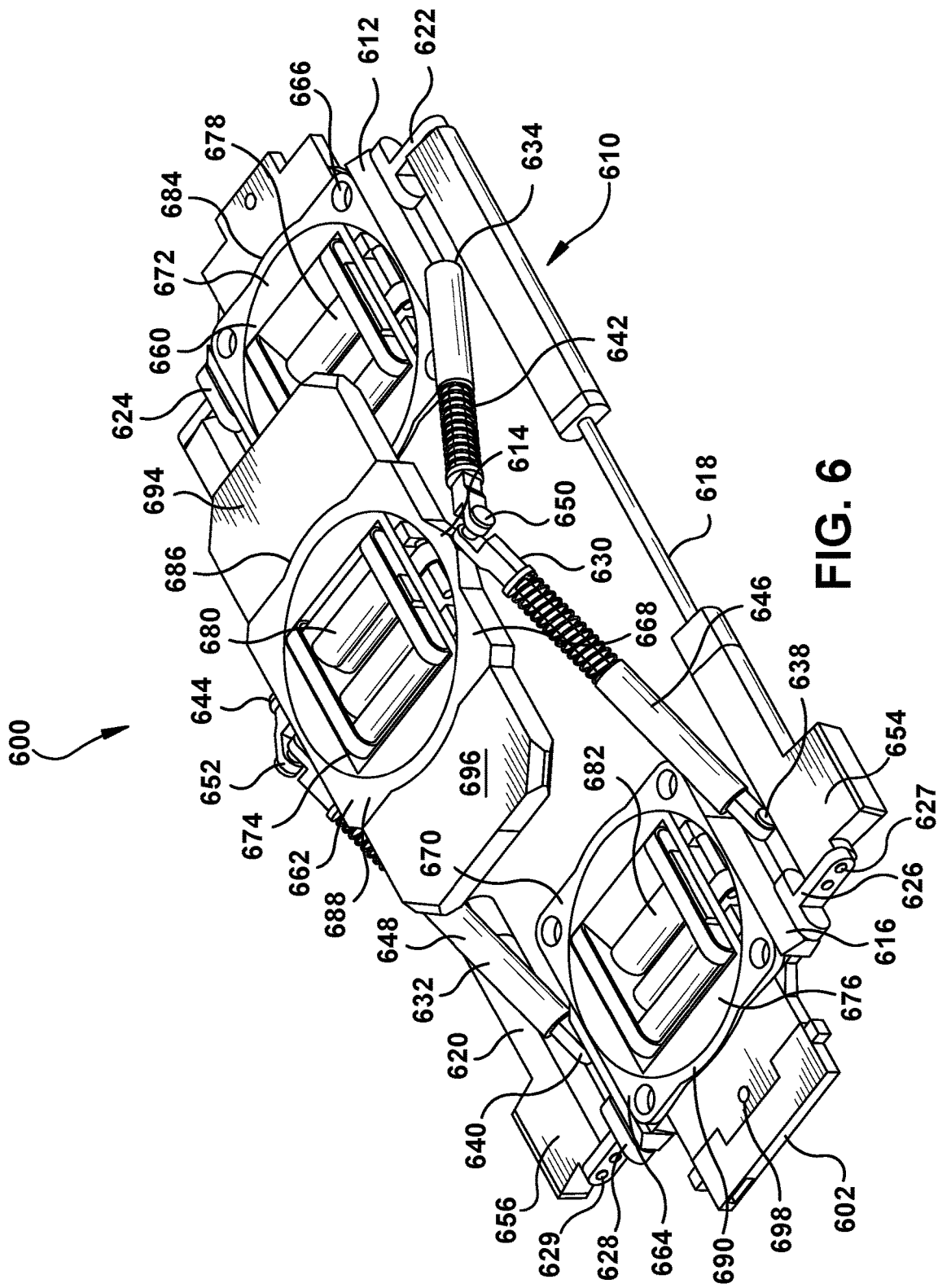
FIG. 6 shows a perspective view of a robotic crawler in its expanded state according to various embodiments of the disclosure.

Referring to FIGS. 6-8, an additional embodiment of a robotic crawler 600 is shown in several views and including an expanded state in FIG. 6 and a collapsed state in FIGS. 7-8. In some embodiments, robotic crawler 600 is a modular robot with an expandable body 610 including plurality of frames 612, 614, 616 for accommodating removable modules. Removable modules may include traction modules 660, 662, 664 that provide rollers, such as wheels, tracks, or balls, or another form of locomotion for moving robotic crawler 600 along the surfaces within a gap. Robotic crawler 600 may also accommodate a plurality of sensor modules, such as navigation sensors, visual inspection sensors, structural test sensors, or electrical test sensors, using sensor interfaces that provide mechanical and/or electrical/communication/control between robotic crawler 600 and the sensor modules. For example, one or more module frames may include sensor interfaces and/or the traction modules or other sensor modules may include sensor interfaces for chaining multiple modules from a single frame. The plurality of sensor interfaces may be provided at several positions on robotic crawler 600 to provide different operating positions for various sensors. For example, each of traction modules 660, 662, 664 may include one or more sensor interfaces and related sensor positions. In some embodiments, there may be multiple configurations of sensor interfaces. For example, sensor interfaces for attachment to traction modules 660, 662, 664 may be different than sensor interfaces between serial sensor interfaces. Other modules may also be provided for other functions, such as a tether connector module 602.

In some embodiments, expandable body 610 includes generally rectangular base frame and includes lateral members 618, 620 on the long sides of the rectangle, connected to front frame 612 and rear frame 616 providing the short sides of the rectangle. Lateral members 618, 620 may include frame attachments 622, 624, 626, 628 proximate their respective distal ends. Frame attachments 622, 624 may connect to front frame 612 and frame attachments 626, 628 may connect to rear frame 616. In some embodiments, middle frame 614 may be configured to be displaced from the plane of front frame 612 and rear frame 616 to expand the width of expandable body 610 in its expanded state. Middle frame 614 may be attached to extension link members 630, 632, which are connected to the rectangular base frame. For example, extension link members 630, 632 may include pivoting attachments 634, 636, 638, 640 with front frame 612 and rear frame 616 or, alternately, with lateral members 618, 620 proximate their distal ends. Extension link members 630, 632 may be articulated link members with first links 642, 644 and second links 646, 648 having pivoting attachments 650, 652 to middle frame 614. Pivoting attachments 650, 652 may act as an articulated joint in extension link members 630, 632 and move middle frame 614 perpendicular to the plane of the rectangular base frame. Expandable body 610 may include a motor or other actuator for moving middle frame 614. For example, lateral members 618, 620 may include linear actuators 654, 656 for moving front frame 612 relative to rear frame 616, changing the lengths of lateral members 618, 620 and the distance between front frame 612 and rear frame 616. When lateral members 618, 620 are in their fully extended positions, front frame 612, middle frame 614, and rear frame 616 may be in the same plane and expandable body 610 is in its narrowest or collapsed state. As lateral members 618, 620 are shortened by linear actuators 654, 656 and rear frame 616 moves toward front frame 612, extension link members 630, 632 articulate at pivoting attachments 650, 652 and first links 642, 644, second links 646, 648, and lateral members 618, 620 form an isosceles triangle with middle frame 614 moving in a direction perpendicular to the direction of movement between front frame 612 and rear frame 616. Other configurations of expandable bodies are possible, such as one or more frames being mounted on lever arms, scissor jacks, telescoping members, or other displacement mechanisms. In some embodiments, expandable body 610 may incorporate shock absorbers between front frame 612 and rear frame 616 and middle frame 614 to assist in navigating uneven gap spaces. For example, extension link members 630, 632 may incorporate telescoping links with an internal spring to assist with traction on opposed gap surfaces and compensate for some obstacles and/or changes in gap spacing. In some embodiments, lateral members 618, 620 may include emergency releases 627, 629 to disengage lateral members 618, 620 manually in the event of power loss or other failure that prevents control of linear actuators 654, 656. For example, frame attachments 626, 628 may incorporate mechanical fasteners that attach lateral members 618, 620 to frame attachments 626, 628 and these mechanical fasteners may act as emergency releases 627, 629 by enabling a user to release the mechanical fasteners and thereby disengage lateral members 618, 620 to cause expandable body 610 to collapse into its collapsed state. In some embodiments, emergency releases 627, 629 may be screws, bolts, or pins through frame attachments 626, 628 and into lateral members 618, 620 that may be removed to collapse expandable body 610. In some embodiments, expandable body 610 has a lateral shape that is an arc based on the configuration of frames 612, 614, 616 and lateral members 618, 620, most visible in FIG. 8. The arc of expandable body 610 may be configured to complement the curvature of an annular gap in which robotic crawler 600 is intended to operate. For example, the arc or curvature may be similar to the arc of the outer surface of the central cylindrical member or the inner surface of the surrounding cylindrical member that define the annular gap.

In some embodiments, each of frames 612, 614, 616 are configured to receive, position, and retain traction modules 660, 662, 664. For example, traction modules 660, 662, 664 may each be multidirectional traction modules with fixed outer frames 666, 668, 670 to removably attach to frames 612, 614, 616. Traction modules 660, 662, 664 may include rotating inner frames 672, 674, 676 that enable robotic crawler 600 to change the orientation of rollers 678, 680, 682 and direction of movement. Each of traction modules 660, 662, 664 may also include one or more interfaces 684, 686, 688, 690 that may be used to attach sensor modules or other functional modules, directly or in series. For example, traction module 660 may include interface 684 and is shown with a visual sensor module 692. Traction module 662 may include interfaces 686, 688 and visual sensor modules 694, 696. Traction module 664 may include interface 670, visual sensor module 698, and tether connector module 602.

Figure 9:
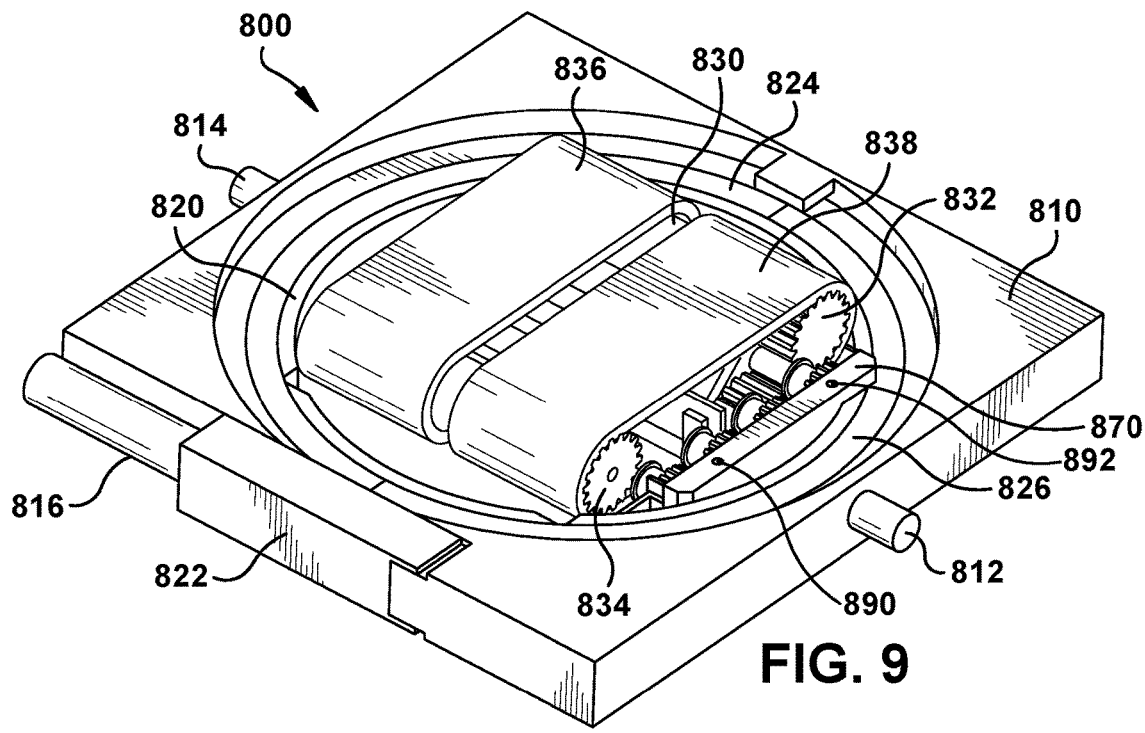
FIG. 9 shows a perspective view of a multidirectional traction module according to various embodiments of the disclosure.

FIG. 9 shows an example multidirectional or omnidirectional traction module 800 according to various embodiments. Multidirectional generally refers to the ability to go in more than one direction. However, as used herein, it refers to more than two directions (e.g., more than just forward and reverse for a fixed drive system) to include the ability to change angular orientation. For example, a multidirectional robot may move in both axial and circumferential orientations and forward and reverse in both orientations, providing movement in at least four directions. A drive system capable of a 90 degree change in orientation, in addition to forward and reverse, may be an effectively multidirectional drive system. Multidirectional may include more than two operable orientations as well, such as positions between the 90 degree change from axial and circumferential orientation. Omnidirectional refers to the ability to select any orientation around a 360 degree arc, within reasonable control parameters. Omnidirectional traction modules may be a subset of multidirectional traction modules. The combination of a 180 degree rotational arc for orientation changes and a reversible drive systems (forward/reverse) may provide effective omnidirectional navigation. In some embodiments, a traction controller may be continuously omnidirectional, meaning that there is no limitation to how many times it may rotate around its 360 degree arc in one direction or another. In general, continuously omnidirectional drive systems may not be constrained by fixed connections, such as wires, that may limit rotations.

Traction module 800 may be configured for use in a robotic crawler, such as robotic crawlers 110, 210, 510, 600.

Traction module 800 may also be configured for use in other modular robots. Traction module 800 enables the direction and orientation of travel of a robotic crawler to be changed without changing the orientation of the robotic crawler itself. In some embodiments, a plurality of traction modules, such as traction module 800, may be attached to the same robot but independently controlled to enable each to change orientation independently, further increasing the maneuverability of the robot to which they are attached. Traction module 800 may include a fixed outer frame 810 with one or more attachment features 812, 814 configured for attachment to a robotic crawler, such as insertion into a body frame. In some embodiments, traction module 800 may also include an electrical interconnect 816 for power and/or control signals from the robotic crawler to traction module 800. Traction module 800 may include a rotating frame 820 seated within fixed outer frame 810 and capable of rotational movement relative to fixed outer frame 810. For example, rotating frame 820 or fixed outer frame 810 may include an actuator 822, such as a motor and worm gear from for moving rotating frame 820. In some embodiments, rotating frame 820 may rotate 90 degrees to change the orientation and direction of travel. In some embodiments, rotating frame 820 may traverse or be stopped in various positions or orientations along at least a 90 degree arc and/or up to a 360 degree arc. In some embodiments, rotating frame 820 may repeatedly traverse a 360 degree arc in either direction for any number of rotations without any fixed connections and provide continuous omnidirectional control. In some embodiments, the worm gear or other drive mechanism incorporates an encoder (not shown) to measure the angular position or orientation of rotating frame 820. For example, a threaded worm gear may engage a mating edge on the outer diameter of rotating frame 820 such that rotation of the shaft of the worm gear translates into a defined angular change in the orientation of rotating frame 820. In some embodiments, reference arcs 824, 826 may provide visual reference through reflective and non-reflective coatings to allow an optical sensor 828 to ascertain the orientation of traction module 800. Rotating frame 820 may provide a first position corresponding to forward and/or reverse (which may generally correspond to the axial direction within an annular gap). In some embodiments, roller assembly 830 is disposed within rotating frame 820 and includes a configuration of rollers 832, 834 for providing rotating traction to move the robotic crawler in a direction of rotation. Roller assembly 830 may also include a motor or other actuator for rotating rollers 832, 834. Roller assembly 830 and/or rotating rollers 832, 834 and their respective actuators may examples of drive systems or drives. A drive system or drive may be any powered system of mechanical locomotion, including but not limited to rolling systems like tracks and wheels with their associated actuators (e.g. electric motors). In some embodiments, roller assembly 830 may be driven in a forward or reverse direction in addition to changes in orientation from rotation of rotating frame 820. In some embodiments, rollers 832, 834 may engage and rotate belts 836, 838 to provide traction for traction module 800. For example, belts 836, 838 may substantially cover the length of rollers 832, 834 to provide a large contact area with adjacent machine surfaces. In some embodiments, the combined width of the belts or tracks may be at least half the total width of rotating platform 820. In some embodiments, belts 836, 838 may include surface features or treatments to improve traction, such as a textured surface for providing grip on oily surfaces. In some embodiments, roller assembly 830 may include a roller configuration actuator 870 to support multiple traction configurations and mechanisms for changing between configurations and locking the selected configuration in place. In some embodiments, the motion and direction of belts 836, 838 may be independently controlled. Driving rollers 832, 834 and belt 838 in one direction while driving corresponding rollers (not shown) and belt 836 in the opposite direction may actuate the change in roller configuration and roller configuration actuator 870 may primarily include a locking and unlocking mechanism. Roller assembly 830 may be capable of switching between a flat mode to provide a lower profile and an obstacle or clearance mode with angled belt paths for increasing the clearance between the robotic crawler and the surfaces it is traveling on. Roller configuration actuator 870 may actuate the change between the two modes and provide a locking mechanism for holding each configuration. In some embodiments, roller configuration actuator 870 may incorporate emergency releases 890, 892 that may be actuated to return roller assembly 830 to the flat mode in the event of a power failure or other loss of control of roller configuration actuator 870.

Figure 10:
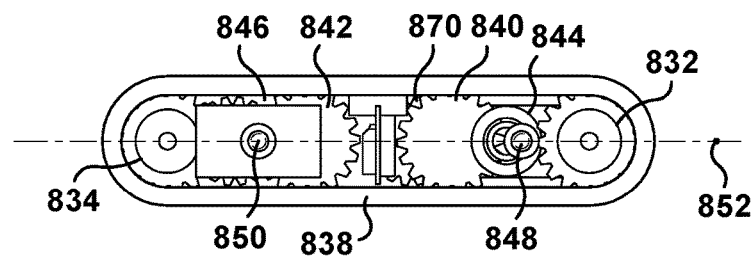
FIG. 10 shows a side section view of a traction assembly in its flat mode.
Figure 11:
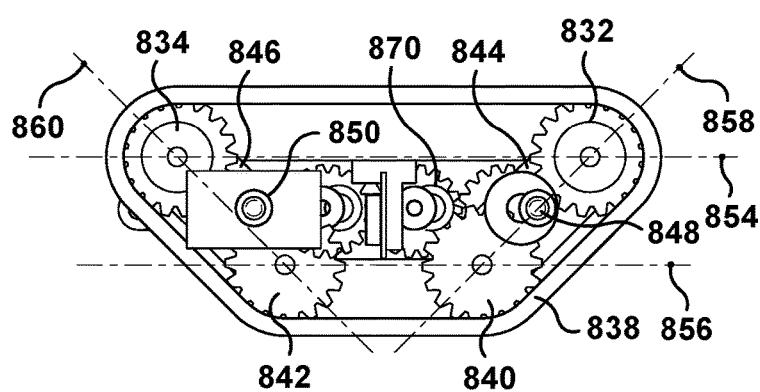
FIG. 11 shows a side section view of the traction assembly of FIG. 10 in its clearance mode.
Figure 12:
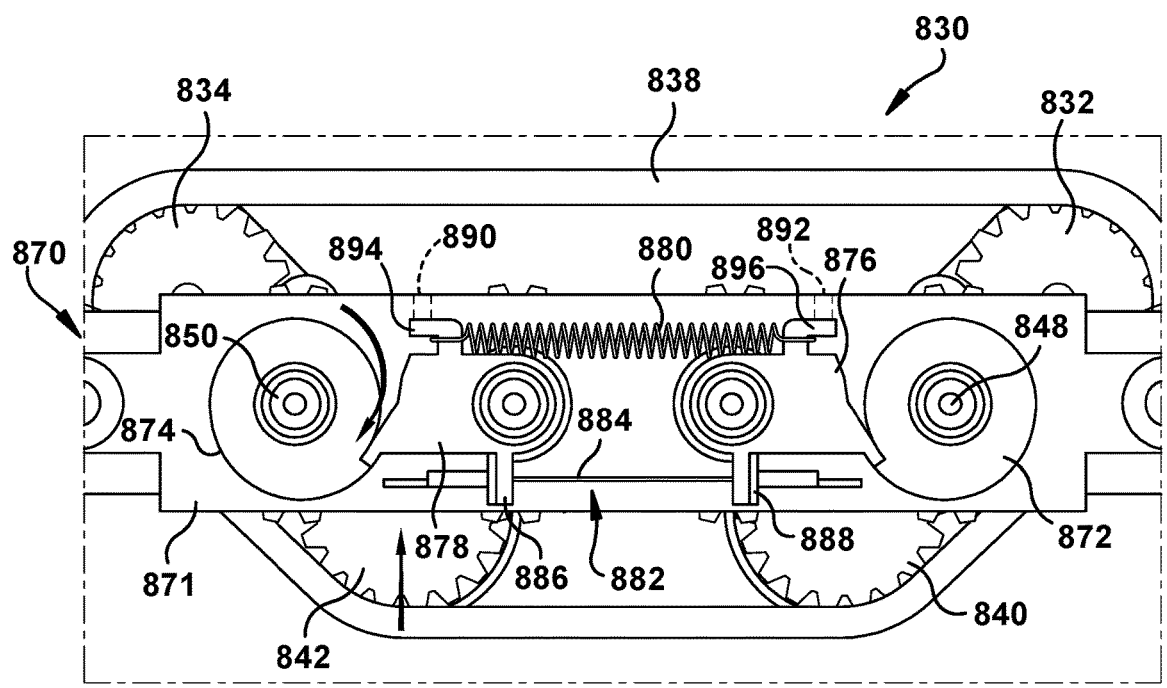
FIG. 12 shows a side section view of a position lock for the traction assembly of FIGS. 10-11.

FIGS. 10-12 show roller assembly 830 in flat mode (FIG. 10) and clearance mode (FIG. 11) and roller configuration actuator 870 (FIG. 12) for maintaining the two modes. Roller assembly 830 may have rollers 832, 834, 840, 842 in paired axle assemblies 844, 846. Axle assemblies 844, 846 may be rotatable around central pivot attachments 848, 850 to adjust between flat mode and clearance mode. In flat mode, each axis of rotation of rollers 832, 834, 840, 842 may be aligned in a single plane 852. In clearance mode, axle assemblies 844, 846 rotate rollers 832, 834, 840, 842 out of the shared plane and define at least two distinct planes 854, 856, 858, 860 of operation. For example, plane 854 aligns with the axis of rotation of rollers 832, 834 which support a parallel return path for belts 836, 838. Plane 856 aligns with axis of rotation of rollers 840, 842 which support a primary traction path for belts 836, 838. Plane 854 is distinct from plane 856. Plane 858 aligns with axis of rotation of rollers 832, 840 (on axle assembly 844) which supports a first climbing traction surface or return path (depending on the direction of travel). Plane 860 aligns with axis of rotation of rollers 834, 842 (on axle assembly 846) which supports a second climbing traction surface or return path (depending on the direction of travel). Once rollers 832, 834, 840, 842 are rotated out of common plane 852, a reaction force between the adjacent machine surface and primary traction surface may encourage reverse rotation to return to flat mode and a locking mechanism 871 may be included within roller configuration actuator 870 to counteract this tendency. In some embodiments, locking mechanism 871 may include ratchet ends 872, 874 on pivot attachments 848, 850 with claw members 876, 878 to engage ratchet ends 872, 874 and hold them in place in clearance mode under tensioning force from spring 880. A powered release mechanism 882 may be provided to controllably supply an opposing force to the tensioning force from spring 880. For example, a shape memory alloy wire 884 between two lever arms 886, 888 may contract when heated to release ratchet ends 872, 874 and allow roller assembly 830 to return to flat mode. An electric solenoid or other actuator may provide a similar powered release mechanism 882. Locking mechanism 871 may include manual emergency releases 890, 892. For example, emergency releases 890, 892 may be openings that provide access to manual release levers 894, 896 incorporated into locking mechanism 871 for holding roller assembly 830 in obstacle or clearance mode. In some embodiments, a pin or similar tool is guided manually into the openings of emergency releases 890, 892 to actuate manual release levers 894, 896. Other configurations for manually actuating emergency releases 890, 892 may include spring loaded buttons, spring pins, levers, or similar actuator members.

Figure 13:
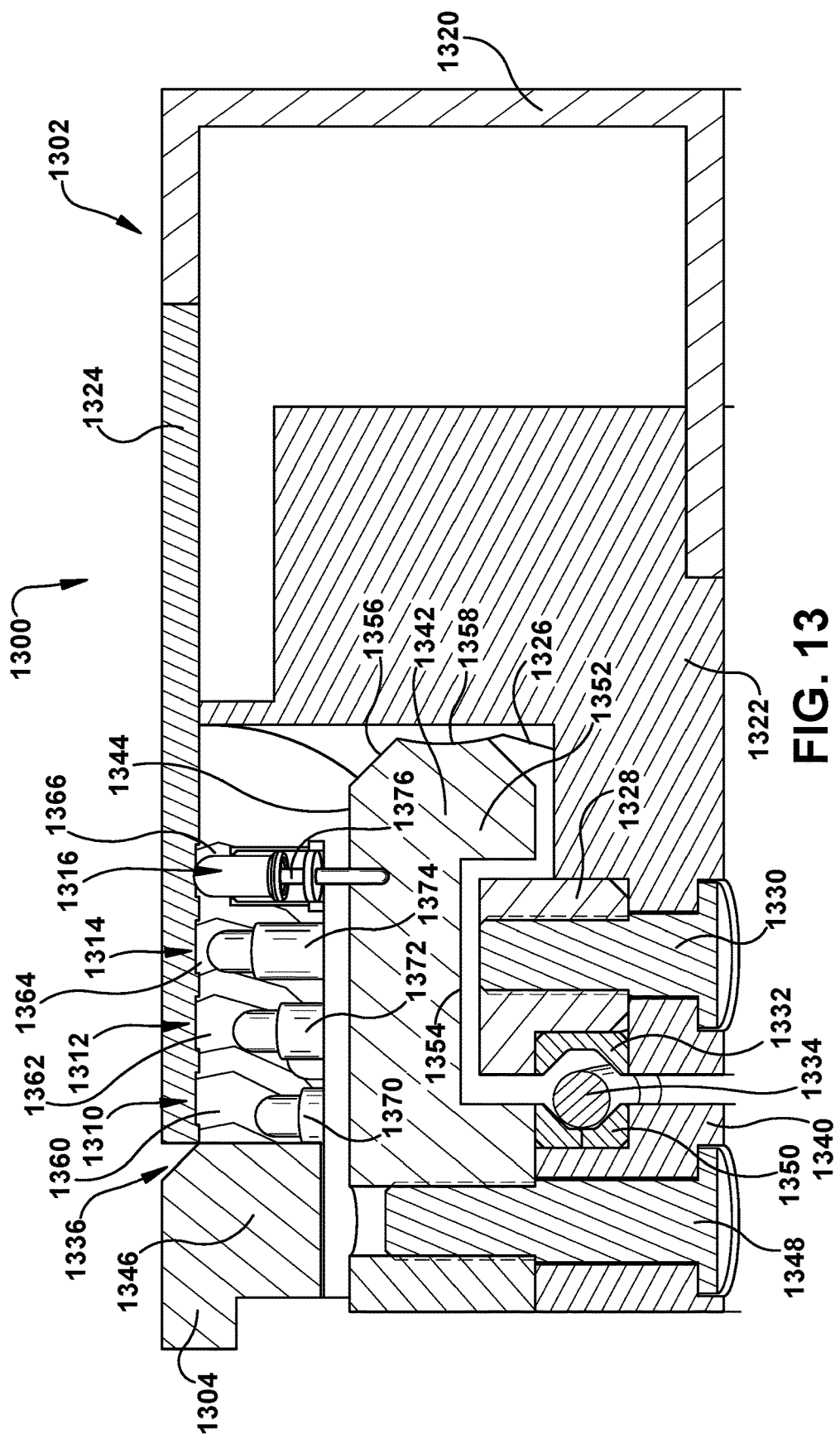
FIG. 13 shows a section view of a portion of a multidirectional traction module according to various embodiments of the disclosure.

Referring to FIG. 13, a cutaway view of an example traction module 1300 at the interface between outer frame 1302 and rotating frame 1304 and is shown at a circumferential location proximate electrical interconnects 1310, 1312, 1314, 1316. Outer frame 1302 may include an outer housing 1320, an interior frame 1322, and a top cover 1324. Outer housing 1320 may provide the lateral surfaces for traction module 1300, including at least a portion of mating surfaces for other components, such as sensor modules or sensor interface adapters, and may incorporate various attachment or interconnect features and/or openings for accommodating them at various points around the perimeter of traction module 1300. Interior frame 1322 may provide a rigid structure for supporting and engaging rotating frame 1304. Interior frame 1322 may define a circular mounting space 1326 and provide a bearing ring 1328 for supporting rotating frame 1304. In some embodiments, bearing ring 1328 may be attached to interior frame 1322 by a plurality of fasteners 1330 spaced around the circumference of bearing ring 1328. Interior frame 1322 and bearing ring 1328 may also accommodate a seal seat 1332 for receiving and positioning a seal ring 1334 between interior frame 1322 and rotating frame 1304. Top cover 1324 may provide at least a partial cover over interior frame 1322 and the interface between outer frame 1302 and rotating frame 1304, while providing a circular drive opening 1336 through which the traction drives, such as rollers, tracks, belts, or wheels, may protrude and rotate with rotating frame 1304. In some embodiments, top cover 1324 may provide a mounting surface for electronics and other components. For example, top cover 1324 may be a printed circuit board with one or more integrated and/or surface mounted components, as well as one or more fixed interconnects to or through outer frame 1302 and/or one or more electrical interconnects for traction module 1300 to connect to a robot system.

Rotating frame 1304 may include a base member 1340, rotating ring 1342, electronics board 1344, and cover member 1346. Base member 1340 may be attached to rotating ring 1342 by a plurality of fasteners 1348 and may accommodate a seal seat 1350 for accommodating and positioning seal ring 1334 between outer frame 1302 and rotating frame 1304. Rotating ring 1342 may include a lip 1352 defining a bearing recess 1354 for engaging bearing ring 1328. In some embodiments, rotating ring 1342 may include an outer edge 1356 defining a threaded groove 1358 for engaging a worm gear or another actuator for controllably turning rotating frame 1304. In some embodiments, electronics board 1344 may provide a mounting surface for electronics and other components that rotate with rotating frame 1304 and may include fixed electrical interconnects to drive systems, roller position actuators, and other electrical subcomponents within rotating frame 1304. Cover member 1346 may provide a top cover for at least a portion of rotating frame 1304 between exposed traction drive components (such as rollers, tracks, belts, or wheels) and top cover 1324 of outer frame 1302. In some embodiments, base member 1340 and cover member 1346 may at least partially define one or more compartments for mechanical actuators and subsystems, such as drive motors, positioning components, and locking mechanisms.

Outer frame 1302 and rotating frame 1304 may include one or more electrical interconnects, such as electrical interconnects 1310, 1312, 1314, 1316, to provide one or more electrical channels between outer frame 1302 and rotating frame 1304. In the example shown, four separate electrical channels through electrical interconnects 1310, 1312, 1314, 1316 are provided and may provide power and/or control signals to multiple subsystems, such as a first traction drive systems, a second traction drive system, and a position lock release. Each of electrical interconnects 1310, 1312, 1314, 1316 may include a first electrical interconnect on outer frame 1304 and a mating electrical interconnect on rotating frame 1304. In some embodiments, electrical interconnects 1310, 1312, 1314, 1316 each include a circular conductive track from circular conductive tracks 1360, 1362, 1364, 1366 on top cover 1324 and a spring-loaded conducting pin from conducting pins 1370, 1372, 1372, 1376 on electronics board 1344. In other embodiments, different types of moving interconnects may be provided and/or the circular interconnects and mating interconnects may be switched between top cover 1324 and electronics board 1344.

Figure 14:
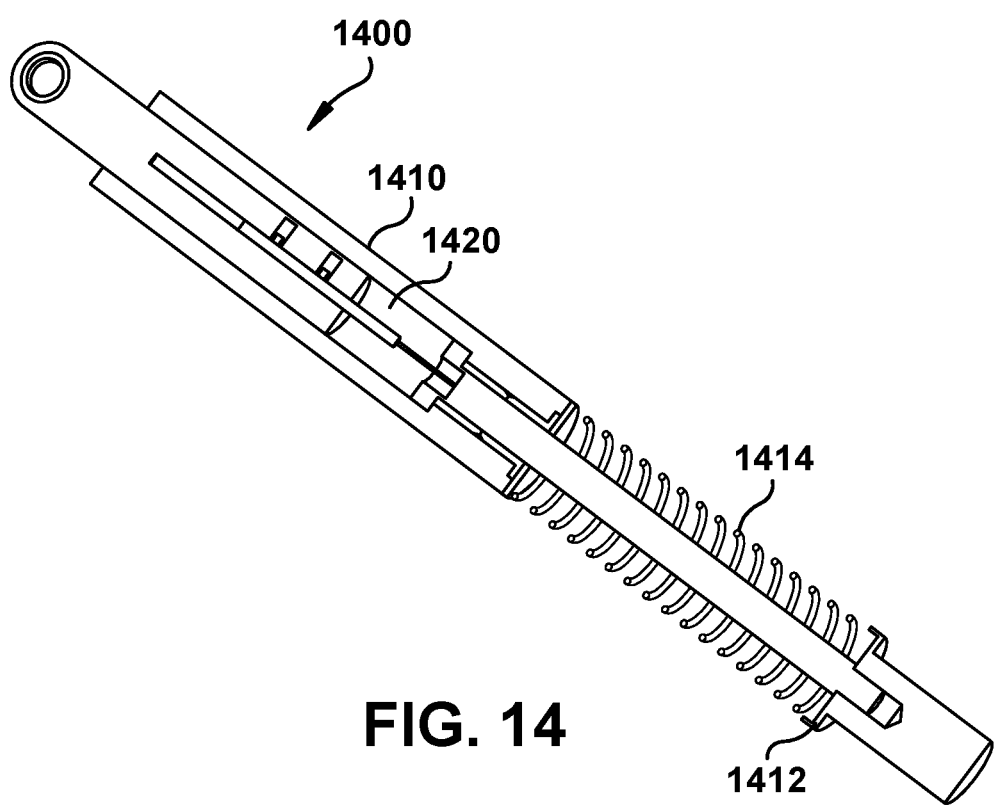
FIG. 14 shows a side cross-sectional view of an expansion link according to various embodiments of the disclosure.

Referring to FIG. 14, a cross-section view of an example connecting link 1400, such as may be used for first links 642, 644 or second links 646, 648 in FIGS. 6-8, and incorporating a shock absorber is shown. Connecting link 1400 may include a first telescoping member portion 1410 and a second telescoping member portion 1412 held in movable relation to one another by a spring 1414 to provide a shock absorber. Note that other configurations of compactible but resistive link members (shock absorbers) are possible, including the use of pneumatic, fluid, or magnetic resistance between rigid members and/or the use of one or more flexible members. The force necessary to compact spring 1414 and shorten connecting link from its resting or maximum length to a compacted length may be configured by adjusting the spring constant and/or frictional forces resisting such displacement. In some embodiments, connecting link 1400 may include a displacement transducer 1420 or other sensor for detecting the change in length of connecting link 1400. Displacement transducer 1420 may generate a signal indicative of the length change and communicate that signal to the robotic crawler or a control system for the robotic crawler. In some embodiments, displacement transducer 1420 will be mated with a wireless communication subsystem for providing sensor data. In some embodiments, displacement transducer 1420 will have a wired connection to a data bus for sensor and other operational data within a robotic crawler. In some embodiments, displacement data from displacement transducer 1420 may be used to adjust the distance of the expanded state of the robotic crawler to compensate for changes in gap width or particular obstacles and/or maintain a desired degree of force between traction modules and the surfaces of the gap.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A traction module for a robot, the traction module comprising:
   an outer frame;
   a rotating frame rotatably mounted within the outer frame;
   at least one drive system mounted within the rotating frame, the at least one drive system having a fixed orientation within the rotating frame, wherein the at least one drive system includes a set of positionable rollers movable between a flat mode and a clearance mode, wherein each of the set of positionable rollers has a respective axis of rotation and the flat mode aligns each axis of rotation of the set of positionable rollers in a plane and the clearance mode aligns each axis of rotation of the set of positionable rollers in at least two distinct planes; and
   an actuator operatively connected to the rotating frame to controllably rotate the rotating frame to a desired orientation.

2. The traction module of claim 1, wherein the outer frame includes at least one attachment feature for securing the traction module to the robot and at least one electrical interconnect to the robot.

3. The traction module of claim 1, wherein the rotating frame has a 360 degree arc to orient the at least one drive system at any position along the 360 degree arc relative to the outer frame.

4. The traction module of claim 1, further comprising an orientation reference and an orientation sensor that determine an initial orientation for the actuator to control the desired orientation.

5. The traction module of claim 1, further comprising a 360 degree electrical contact and a mating electrical contact in contact with the 360 degree electrical contact, wherein an electrical connection between the outer frame and the rotating frame is continuous in any orientation of the rotating frame relative to the outer frame.

6. The traction module of claim 5, further comprising a plurality of 360 degree electrical contacts and a plurality of mating electrical contacts in contact with the plurality of 360 degree electrical contacts and defining a plurality of electrical channels between the outer frame and the rotating frame.

7. The traction module of claim 1, wherein the at least one drive system includes a first belt drive and a second belt drive, and the first belt drive is controlled independently from the second belt drive.

8. The traction module of claim 1, wherein the at least one drive system includes a ratchet locking mechanism that locks the set of positionable rollers in the clearance mode until released.

9. The traction module of claim 8, wherein the ratchet locking mechanism includes at least one ratchet wheel, at least one spring-loaded pawl to hold a lock position on the at least one ratchet wheel, and a pawl release actuator to release the at least one spring-loaded pawl from the lock position.

10. The traction module of claim 1, wherein the set of positionable rollers includes at least one manual emergency release that moves the set of positionable rollers from the clearance mode to the flat mode without a control signal from the robot.

11. The traction module of claim 1, wherein the at least one drive system includes a first belt drive and a second belt drive, and movement between the flat mode and the clearance mode includes driving the first belt drive in a forward direction and the second belt drive in a reverse direction while the rotating frame is held in a fixed orientation relative to the outer frame.

12. The traction module of claim 1, wherein the actuator includes a worm gear and rotation of a worm bearing attached to the outer frame engages a wheel gear surrounding the rotating frame.

13. The traction module of claim 1, further comprising a position encoder in the actuator that measures an angular position of the rotating frame, wherein a control system of the robot uses the angular position of the rotating frame to steer the robot.

14. The traction module of claim 1, wherein the at least one traction module includes a first track drive with a first track width and a second track drive with a second track width, wherein a sum of the first track width and the second track width is at least one half of an inner diameter of the rotating frame.

15. The traction module of claim 1, wherein the robot is a robotic crawler with an expandable body for navigating an annular gap in a generator, electric motor, or turbomachine, and the robot further comprises at least one link member positioning the traction module against a surface in the annular gap, wherein the at least one link member includes a shock absorber and a displacement transducer, the displacement transducer measuring the displacement of the shock absorber to control surface contact between the traction module and the surface in the annular gap.

16. A robot system comprising:
   a robot body;
   a control system;
   at least one traction module attached to the body, the traction module including:
      an outer frame;
      a rotating frame rotatably mounted within the outer frame;
      at least one drive system mounted within the rotating frame, the at least one drive system having a fixed orientation within the rotating frame and for receiving a move control signal from the control system; and
      an actuator operatively connected to the rotating frame to controllably rotate the rotating frame to a desired orientation in response to a direction control signal from the control system; and
   at least one link member for positioning the at least one traction module against a surface being navigated by the robot system, wherein the at least one link member includes a shock absorber and a displacement transducer, and the displacement transducer measures the displacement of the shock absorber and provides a measurement signal to the control system to adjust an operating position of the at least one traction module to change a surface contact force between the at least one traction module and the surface being navigated.

17. A modular robot system comprising:
a plurality of modular frame members including at least one link member with a shock absorber;
a plurality of traction modules removably attached to the plurality of modular frame members to position the plurality of traction modules against at least one surface of a machine, the plurality of traction modules including at least one drive system mounted within a rotating frame and rotatable to orient the at least one drive system around a 360 degree arc;
a plurality of sensor interface adapters removably attached to the plurality of traction modules; and
a plurality of sensor modules removably attached to the plurality of sensor interface adapters.

18. The modular robot system of claim 17, wherein the at least one link member with a shock absorber further includes a displacement transducer, the displacement transducer for measuring the displacement of the shock absorber to adjust operating positions of the plurality of traction modules to change a surface contact force between the plurality of traction modules and the at least one surface of the machine.

\* \* \* \* \*